United States
White

[11] 3,990,798
[45] Nov. 9, 1976

[54] METHOD AND APPARATUS FOR ALIGNING MASK AND WAFER

[75] Inventor: Alan David White, Berkeley Heights, N.J.

[73] Assignee: Bell Telephone Laboratories, Incorporated, Murray Hill, N.J.

[22] Filed: Mar. 7, 1975

[21] Appl. No.: 556,224

[52] U.S. Cl. ................................ 356/172; 350/14; 350/175 DR; 356/114
[51] Int. Cl.² ...................... G01B 11/27; G02B 3/10
[58] Field of Search .............. 356/114, 172; 350/14, 350/175 DR

[56] References Cited
UNITED STATES PATENTS

| | | | |
|---|---|---|---|
| 2,601,175 | 6/1952 | Smith | 350/12 |
| 3,488,104 | 1/1970 | Doherty | 350/81 |
| 3,520,592 | 7/1970 | Leib et al. | 350/150 |
| 3,558,210 | 1/1971 | Smith | 350/12 |
| 3,751,170 | 8/1973 | Hidaka | 356/172 |

*Primary Examiner*—John K. Corbin
*Assistant Examiner*—Richard A. Rosenberger
*Attorney, Agent, or Firm*—Roderick B. Anderson; Michael J. Urbano

[57] ABSTRACT

In a semiconductor photolithographic mask alignment system, a unique bifocus element is included in the microscope for permitting simultaneous focusing on the mask and semiconductor wafer surface, even though the mask and wafer separation is greater than the microscope depth of field. The bifocus element is preferably located at the rear focal plane of the microscope objective and is designed to image, at the same location, light from the mask polarized in a first direction and light from the wafer polarized at right angles to the first direction.

10 Claims, 3 Drawing Figures

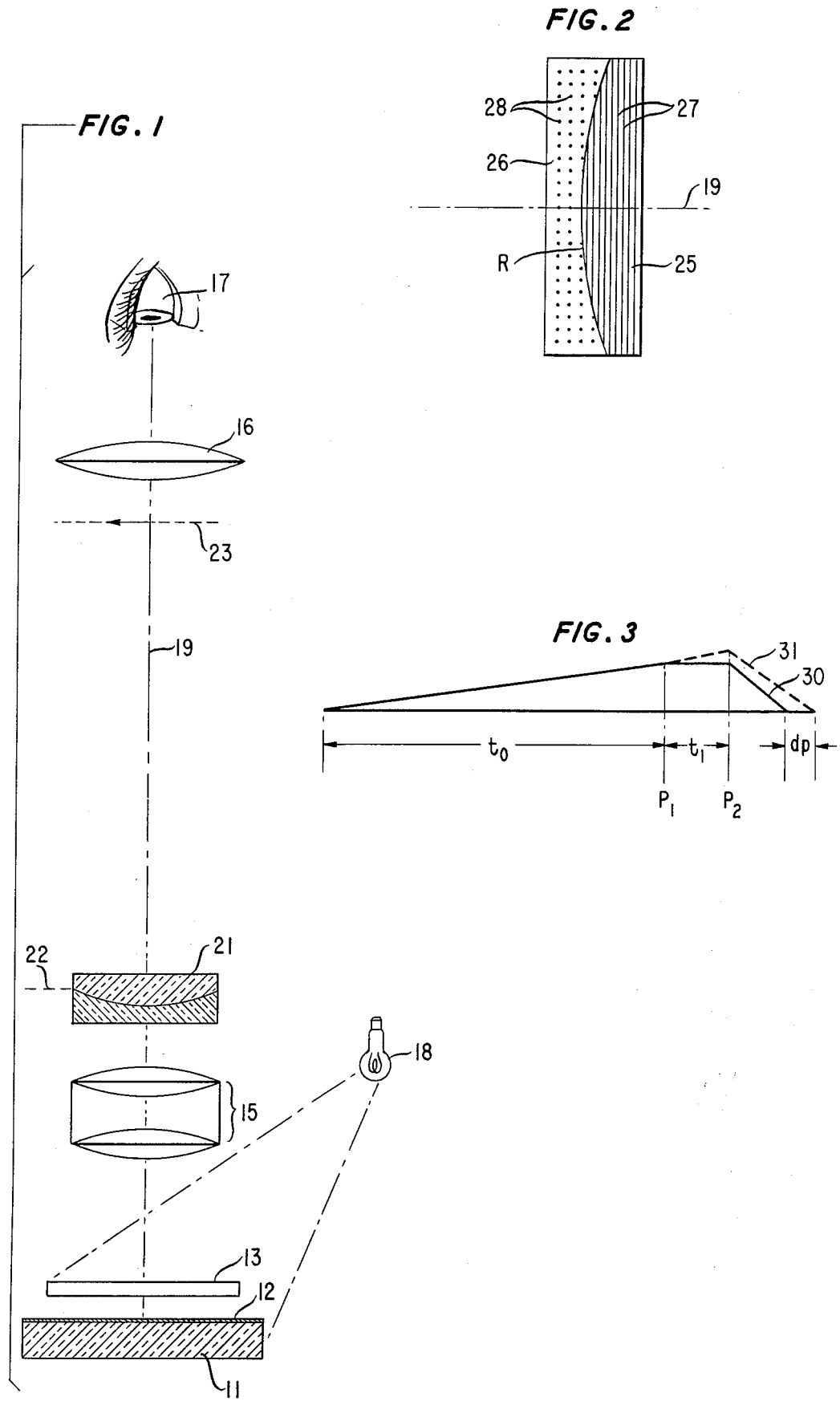

METHOD AND APPARATUS FOR ALIGNING MASK AND WAFER

BACKGROUND OF THE INVENTION

This invention relates to techniques for aligning microscopic patterns, and more particularly, to techniques for aligning a photolithographic mask with a semiconductor wafer pattern, as is required in semiconductor integrated circuit fabrication.

In the fabrication of semiconductor devices by photolithographic techniques, a semiconductor wafer is coated with a photosensitive film referred to as photoresist and selectively exposed to light projected through a mask in close proximity to, or in contact with, the wafer coating. Development of a selectively exposed photoresist, followed by an etching and diffusion into the wafer, permits patterns of various conductivity or different materials to be defined on the wafer surface. The complete fabrication of modern integrated circuits requires several such printing steps to be performed successively with each mask exposure being in precisely controlled registration with previously defined wafer patterns. Because the patterns on the masks and wafer have extremely small dimensions, a microscope is normally required for making the mask alignment.

To give sufficient resolution to meet stringent accuracy requirements, the microscope must have a large numerical aperture, and as a consequence, it has a small depth of field. However, to permit the operator to move the wafer relative to the mask to achieve registration without abrading the photoresist coating, the mask and wafer must be physically separated. This separation, which may typically be on the order of 20–60 microns, may be greater than the depth of field of the high-power microscope needed for making the registration.

Since the operator cannot observe the mask and wafer simultaneously, it is typically necessary for him to make separate alignment of the separated mask and wafer, then again observe the alignment after bringing them into contact, and, if necessary, separate them again for realignment. This process of separating and contacting, which is repeated until the desired alignment accuracy is achieved, is time consuming and frequently results in abrasion of the photoresist, as well as degradation of the mask and wafer features.

SUMMARY OF THE INVENTION

I have found that the separated mask and wafer can be simultaneously observed by including an appropriately designed bifocus element in the microscope, preferably at the back focal plane of the microscope objective. The bifocus element is composed of a birefringent positive lens, and a birefringent negative lens of preferably equal, but opposite power with mutually perpendicular crystal axes. With properly designed birefringent lens elements, light of one polarization from the mask will be imaged at the same location as light of the other polarization from the wafer, thus permitting the mask and wafer to be observed simultaneously. Actually, double images of both the mask and wafer will be formed, but because of the limited depth of field of the microscope, the unwanted images will be out-of-focus to the observer.

In the simplest implementation of the invention the powers of the two birefringent lens elements are approximately equal in magnitude but opposite in sign. With this being so, compliance with the following approximate relation will result in the images of the mask and wafer surfaces being brought to focus at a single (common) plane.

$$dp = 2f^2|P_x| = 2f^2|P_y| \tag{1}$$

where $dp$ is the distance between the mask and wafer surfaces, $f$ is the focal length of the microscope objective, $|P_x|$ is the magnitude of the power of the bifocus element with respect to light polarized in one direction relative to the crystal optic axis, and $|P_y|$ is the magnitude of the power with respect to the oppositely polarized light. As will be explained later, the bifocus element is preferably formed by making the positive lens portion with an optic axis perpendicular to the microscope central axis and with the negative lens portion having an optic axis perpendicular to both the microscope axis and the positive lens optic axis.

Since operation of the invention requires discrimination between the light of different polarizations, it is important to illuminate the mask and wafer with light having parallel and perpendicular polarization components. With this arrangement, the operator is free to move either the mask or the wafer without risk of abrasion or other damage, while observing them both in microscopic detail simultaneously.

These and other objects, features and advantages of the invention will be better understood from a detailed consideration of the detailed description taken in conjunction with the accompanying drawing.

DRAWING DESCRIPTION

FIG. 1 is a schematic view of a double focusing microscope system in accordance with an illustrative embodiment of the invention;

FIG. 2 is a schematic sectional view of the birefringent element of the system of FIG. 1; and FIG. 3 is a schematic illustration of various distance parameters in the system of FIG. 1.

DETAILED DESCRIPTION

Referring now to FIG. 1, there is shown schematically a microscopic system used by an operator for registering a semiconductor wafer 11, having a coating 12 of photoresist, with a photolithographic mask 13. The wafer surface and the mask both typically contain microscopic patterns which must be accurately aligned, and so the microscope used must be of a relatively high power with a necessarily limited depth of field. As described before, an inability to focus on both simultaneously greatly complicates the aignment procedure. For purposes of illustration, the microscope objective is indicated as lens 15, the eyepiece is lens 16, and the operator is shown at location 17. Light from a source 18 is reflected from both the mask and wafer and projected along a microscope central axis 19 to the eyepiece.

In accordance with the invention a bifocus element 21 is located along the microscope axis 19 and is preferably located at the rear focal plane 22 of the microscope objective. The source 18 is ordinarily a white light source, and as such contains orthogonally polarized components, both being perpendicular to the axis 19; as is conventional, these components will be designated as parallel polarized and perpendicularly polarized components, it being understood that these are merely relative designations with respect to the crystal optic axis. The bifocus element is designed, along with the microscope objective, to image parallel polarized light from mask 13 and perpendicular polarized light from the surface of wafer 11 at the same image plane 23 so that they can be observed simultaneously in focus. Necessarily, displaced images of the mask and wafer (of corresponding oppositely polarized light) will also be formed, but since these will not be in focus at plane 23 they will not necessarily detract from observation of the desired images. In other words, the combinaton of the microscope objective and the bifocus element images parallel polarized light from mask 13 at image plane 23 and it also images perpendicular polarized light from wafer 11 at image plane 23 for clear "in focus" viewing by the observer. Perpendicular polarized light from the mask and parallel polarized light from the wafer are imaged at other image planes which are out-of-focus.

The bifocus element is composed of a positive lens and a negative lens both of birefringent material oriented to have their crystal optic axes perpendicular to each other and also perpendicular to the microscope axis 19. Referring to FIG. 2, one embodiment comprises a birefringent plano-convex positive lens 25 cemented to a birefringent plano-concave negative lens 26 of equal radius of curvature R. As indicated in the drawing, lens element 25 has a vertical crystal optic axis indicated schematically by lines 27, while lens element 26 has a crystal optic axis extending "out of the paper" as designated by dots 28. As a result of the birefringence of the lens components, and because the lenses are in contact, the power of the bifocus element for each direction of polarized light may be written as $$P_x = -\frac{(n_e - n_o)}{R} \text{ and } P_y = \frac{(n_e - n_o)}{R} \quad (2)$$

where $(n_e - n_o)$ is the difference in index of refraction between the extraordinary and ordinary rays. In a positive uniaxial birefringent material such as crystal quartz, $(n_e - n_o)$ is positive and approximately equal to 0.0091 in the visible region of the spectrum.

Referring to FIG. 3, consider the microscope objective to have a power $P_2$, the bifocus element to have a power $P_1$, both of them being thin lenses separated a distance $t_i$, with the mask and wafer surface being separated by a distance $dp$. $P_1$ is equal in magnitude to both $P_x$ and $p_y$. Typical rays 30 and 31 from the mask and wafer, respectively, are illustrated. It can be shown that the paraxial expressions for the object plane separation $dp$, and lateral magnification for the combination are $$dp = 2P_1 t_o^2 \div [(1 - 2P_2 t_o - 2P_2 t_1 + P_2^2 t_o^2 + 2P_2^2 t_o t_1 + P_2^2 t_1^2) - P_1^2(P_2^2 t_1^2 t_o^2 - 2P_2 t_1 t_o^2 + t_o^2)]. \quad (3)$$

$$M = 1 - P_1 t_o - P_2 t_o - P_2 t_1 + P_2 P_1 t_o t_1 \quad (4)$$

where $t_o$ is the long conjugate. Computer plots of solutions of Equations 2 and 3 have been made, but for purposes of brevity will not be shown and described. However, it can be shown that the magnification is independent of the sign and magnitude of $P_1$ when the following obtains:

$$t_1 = 1/P_2 \quad (5)$$

This says that when the bifocus element 21 is located at back focal plane 22, the magnification of the images of the mask and wafer at image plane 23 are the same. For this case $dp$ and $M$ are given by $$dp = (2P_1/P_2^2) \quad (6)$$

$$M = -P_2 t_o. \quad (7)$$

As is known, $$P_2 = 1/f \quad (8)$$

where $f$ is the focal length of the microscope objective. From Equations 5 and 7, the design of the bifocus element in terms of the separation distance $dp$ is aproximately given by $$dp = 2f^2 P_1 = 2f^2 |P_x| = 2f^2 |P_y| \quad (9)$$

For the special case of the structure of FIG. 2 in which a plano-convex and a plano-concave lens have a common radius R, that radius is approximately related to $dp$ by the relationship $$R = \frac{f^2 2(n_e - n_o)}{dp} \quad (10)$$

where $(n_e - n_o)$ has been defined previously.

Since the unfocused light from each object plane is present at the image plane 23, some reduction in contrast of the two focused images is inevitable. Experiments in which parallel and perpendicular polarized light were switched at 60 hertz indicate that in most cases little if any benefit is derived from multiplexing the light source; rather it seems more practical simply to illuminate both object planes with white light containing both polarizations. In any case it is presumed that the reduction in contrast is related to the eye's persistence in retaining both the focused images and the background light from the unfocused images.

As mentioned before, locating bifocus element 21 at the rear focal plane 22 gives the same magnification for both object planes. This is particularly desirable when split-field alignment microscopes are used because of significant displacements of alignment marks from the optical axis of the microscope objectives. Differences of magnification are less troublesome if the alignment marks are located on the microscope axis.

A series of experiments were made using quartz birefringent elements having radii of 30, 42, 60 and 117 millimeters placed 2 to 5 millimeters behind the rear element of standard microscope objectives. Table I shows various combinations of radius R (in millimeters) and $dp$ (in microns) with the use of Bausch and Lomb 16× (16 millimeters) and 21× (8 millimeters) objectives.

TABLE I

| R | dp with 10X (16mm) | dp with 21X (8mm) |
|---|---|---|
| 30.0 | 138 | 39 |
| 42 | 105 | 30 |
| 60 | 72 | 20 |
| 117 | 38 | 9 |

From the foregoing it can be appreciated that various separations of mask and wafer can be accommodated by a high power microscope using the invention to observe both elements in focus simultaneously. By illuminating the mask and wafer together with white light having components of orthogonal polarization, the operator can easily make relative movements of the mask and wafer as is required for bringing them into registration in a conventional manner. Also, axial movement of bifocus element 21 can be used to accommodate changes in mask and wafer separation *dp*.

While the bifocus element described provides efficient discrimination between light of the two polarizations, other embodiments could be used. For example, if only one of the lens portions of the bifocus element is birefringent, with its optic axis perpendicular to the central axis, it will provide polarization discrimination in imaging. In general, the preferred embodiment introduces the smallest degree of aberrations into the microscope system.

Various other modifications and embodiments may be made by those skilled in the art without departing from the spirit and scope of the invention.

What is claimed is:

1. In a method for aligning a microscopic mask pattern with a microscopic semiconductor wafer pattern comprising the steps of observing the mask and wafer through a microscope objective having a depth of field smaller than the separation of the mask and wafer, and moving the relative orientation of the mask with respect to the wafer to register the patterns, the improvement comprising the steps of:

illuminating the mask and wafer with light including light of a first polarization and light of a second polarization;

and directing said illuminating light from the mask and wafer through the microscope objective and a bifocus element, said microscopic objective and bifocus element comprising means for imaging light of the first polarization from the mask at a first image plane and light of the second polarization from the wafer at a second image plane, the first and second image planes being substantially coincident, thereby permitting the mask and the wafer to be observed simultaneously.

2. The improvement of claim 1 wherein: the bifocus element comprises at least one lens made of birefringent material having its crystal optic axis extending in a direction perpendicular to the central axis of the microscope objective.

3. The improvement of claim 1 wherein: the bifocus element comprises a positive lens having an optic axis extending in a first direction, and a negative lens having an optic axis extending in a second direction perpendicular to the first direction, the microscopic objective having a central axis perpendicular to both the first and second directions.

4. The improvement of claim 3 wherein: the positive and negative lenses of the bifocus element have powers which are approximately equal in magnitude but opposite in sign.

5. The improvement of claim 4 wherein: the bifocus element is located aprroximately at the back focal plane of the microscope objective.

6. In a method for aligning a microscopic mask pattern with a microscope semiconductor wafer pattern comprising the steps of observing the mask and wafer through a microscopic system having a depth of field smaller than the separation of the mask and wafer and moving the relative orientation of the mask with respect to the wafer to register the patterns, the improvement comprisng the steps of:

forming a bifocus element having a first focal length in response to light of a first polarization and a second focal length in response to light of a second polarization, where the first and second polarizations are mutually orthogonal;

inserting the bifocus element in the microscope system such that the microscope system and bifocus element comprise means for imaging light of the first polarization from the mask and light of the second polarization from the wafer at a common image plane;

and illuminating the mask and wafer with light including light of both the first and second polarizations, thereby permitting the mask and wafer to be observed simultaneously.

7. The method of claim 6 wherein:
   the step of forming the bifocus element comprises the steps of forming a negative lens of birefringent material having an optic axis perpendicular to the central axis of the microscopic system and forming a positive lens of birefringent material having an optic axis perpendiclar to the optic axis of the negative lens and the central axis of the microscopic system.

8. The improvement of claim 7 wherein:
   the positive and negative lenses respectively have powers which are approximately equal in magnitude but of opposite sign.

9. The improvement of claim 8 further comprising the step of separating the mask and wafer a distance approximately given by the relation $$dp = 2f^2 |P_x| = 2f^2 |P_y|$$

where $f$ is the focal length of the microscope objective; $|P_x|$ is the magnitude of the power of the bifocus element with respect to light of the first polarization; and $|P_y|$ is the magnitude of the power of the bifocus element with respect to light of the second polarization.

10. The improvement of claim 8 wherein: the bifocus element is inserted approximately at the back focal plane of the microscope objective.

* * * * *

UNITED STATES PATENT AND TRADEMARK OFFICE
CERTIFICATE OF CORRECTION

PATENT NO. : 3,990,798
DATED : November 9, 1976
INVENTOR(S) : Alan D. White

It is certified that error appears in the above-identified patent and that said Letters Patent are hereby corrected as shown below:

Column 3, line 54, that portion of the equation reading

" $\left[ (1 - 2P_2 t_o - \right.$ "

should read

-- $\left[ (1 - 2P_2 t_o - \right.$ --.

Column 4, line 10, "aprox-" should read --approx- --.

Signed and Sealed this

Twenty-second Day of February 1977

[SEAL]

Attest:

RUTH C. MASON
*Attesting Officer*

C. MARSHALL DANN
*Commissioner of Patents and Trademarks*